(12) United States Patent
Ma

(10) Patent No.: US 10,861,846 B2
(45) Date of Patent: Dec. 8, 2020

(54) ARRAY SUBSTRATE AND DISPLAY PANEL

(71) Applicant: Wuhan China Star Optoelectronics Semiconductor Display Technology Co., Ltd., Wuhan (CN)

(72) Inventor: Yalong Ma, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/326,201

(22) PCT Filed: Nov. 5, 2018

(86) PCT No.: PCT/CN2018/113968
§ 371 (c)(1),
(2) Date: Feb. 17, 2019

(87) PCT Pub. No.: WO2019/227856
PCT Pub. Date: Dec. 5, 2019

(65) Prior Publication Data
US 2020/0185376 A1    Jun. 11, 2020

(30) Foreign Application Priority Data
Jun. 1, 2018   (CN) .......................... 2018 1 0557954

(51) Int. Cl.
*H01L 27/02*    (2006.01)
*G06F 3/041*    (2006.01)
*H01L 23/60*    (2006.01)
*H01L 27/12*    (2006.01)
*H01L 27/32*    (2006.01)

(52) U.S. Cl.
CPC ........ *H01L 27/0292* (2013.01); *G06F 3/0412* (2013.01); *H01L 23/60* (2013.01); *H01L 27/124* (2013.01); *H01L 27/1248* (2013.01); *H01L 27/323* (2013.01); *H01L 27/3276* (2013.01)

(58) Field of Classification Search
None
See application file for complete search history.

(56) References Cited

U.S. PATENT DOCUMENTS

| 8,791,474 B1 * | 7/2014 | Bibl ..................... G09G 3/2003 257/100 |
| 2018/0129330 A1 * | 5/2018 | Ding ..................... G06F 3/0412 |

\* cited by examiner

Primary Examiner — Joseph R Haley

(57) ABSTRACT

The present application relates to an array substrate including a display region and a non-display region. The non-display region encapsulates the display region. The non-display region includes a first region and a second region. The first region is configured to dispose trances. The second region is configured to dispose a driving chip assembly. The first region includes a first subregion. Ground wires are disposed in the first subregion. A number of layers of an end of the ground wires close to the second region is less than a number of layers of an end of the ground wires away from the second region.

18 Claims, 2 Drawing Sheets

ARRAY SUBSTRATE AND DISPLAY PANEL

RELATED APPLICATIONS

This application is a National Phase of PCT Patent Application No. PCT/CN2018/113968 having International filing date of Nov. 5, 2018, which claims the benefit of priority of Chinese Patent Application No. 201810557954.0 filed on Jun. 1, 2018. The contents of the above applications are all incorporated by reference as if fully set forth herein in their entirety.

FIELD OF DISCLOSURE

The present application relates to display technologies, and more particularly, to an array substrate and a display panel.

In the trend of narrow bezel displays, the space for disposing lateral traces is getting smaller. This brings a series of problems, for example, problems caused by electrostatic charges. Since the space is smaller, ground wires become narrow around corners at lateral sides. The ground wires maintain their narrow widths after being narrowed around the corners. At the lateral sides, impedance of the ground wires is large and electrostatic shielding ability is weak. The ground wires expand their widths after being narrowed around the corners. An abrupt change to high impedance is caused for the ground wires at the corners. It is easily to cause electrostatic damages.

Therefore, there is a need to improve the drawbacks in the existing arts.

The present application relates to an array substrate and a display panel, capable of solving problems caused by electrostatic charges.

An embodiment of the present application provides an array substrate, including a display region and a non-display region, the non-display region encapsulating the display region and the display region forming a rectangle;

the non-display region including a first region encapsulating the display region and disposed adjacent to the display region, and a second region separated from a bottom edge of the display region, the second region connecting to the display region via the first region, the first region configured to dispose traces, the second region configured to dispose a driving chip assembly;

the first region including a first subregion encapsulating the display region, circuitous ground wires zigzagged from an inner side to an outer side disposed in the first subregion, a number of layers of an end of the ground wires close to the second region less than a number of layers of an end of the ground wires away from the second region.

In the array substrate of the present application, the first region further includes a second subregion configured to dispose touch signal traces, an inner side of the second subregion connects to both of a left side and a right side of the display region, an outer side of the second subregion connects to an inner side of the first subregion.

In the array substrate of the present application, the first region further includes a third subregion, one side of the third subregion connects to the bottom edge of the display region and another side of the third subregion connects to the first region, the third subregion is configured to dispose display signal trances.

In the array substrate of the present application, a number of the ground wires is two, the two ground wires are symmetrically disposed with respect to the display region, distal ends of the two ground wires are close to each other, proximal ends of the two ground wires extend to the third subregion.

In the array substrate of the present application, each of the ground wires includes a first segment, a second segment, and a third segment;

the first segment is disposed close to an outer side of the first subregion, a first end of the second segment connects to a portion of the first segment close to the second region and a second end of the second segment extends to a location away from a top edge of the display region with a predetermined distance, a first end of the third segment connects to the second end of the second segment and a second end of the third segment extends to the driving chip assembly.

In the array substrate of the present application, wherein the driving chip assembly includes a display driving chip and a touch driving chip, the display driving chip connects to the display signal trances, the touch driving chip connects to the touch signal traces.

An embodiment of the present application further provides an array substrate, including a display region and a non-display region, the non-display region encapsulating the display region;

the non-display region including a first region encapsulating the display region and disposed adjacent to the display region, and a second region separated from a bottom edge of the display region, the second region connecting to the display region via the first region, the first region configured to dispose traces, the second region configured to dispose a driving chip assembly;

the first region including a first subregion encapsulating the display region, circuitous ground wires zigzagged from an inner side to an outer side disposed in the first subregion, a number of layers of an end of the ground wires close to the second region less than a number of layers of an end of the ground wires away from the second region.

In the array substrate of the present application, the first region further includes a second subregion configured to dispose touch signal traces, an inner side of the second subregion connects to both of a left side and a right side of the display region, an outer side of the second subregion connects to an inner side of the first subregion.

In the array substrate of the present application, the first region further includes a third subregion, one side of the third subregion connects to the bottom edge of the display region and another side of the third subregion connects to the first region, the third subregion is configured to dispose display signal trances.

In the array substrate of the present application, a number of the ground wires is two, the two ground wires are symmetrically disposed with respect to the display region, distal ends of the two ground wires are close to each other, proximal ends of the two ground wires extend to the third subregion.

In the array substrate of the present application, each of the ground wires includes a first segment, a second segment, and a third segment;

the first segment is disposed close to an outer side of the first subregion, a first end of the second segment connects to a portion of the first segment close to the second region and a second end of the second segment extends to a location away from a top edge of the display region with a predetermined distance, a first end of the third segment connects to the second end of the second segment and a second end of the third segment extends to the driving chip assembly.

In the array substrate of the present application, wherein the driving chip assembly includes a display driving chip and a touch driving chip, the display driving chip connects to the display signal trances, the touch driving chip connects to the touch signal traces.

A display panel includes an array substrate including a display region and a non-display region, the non-display region encapsulating the display region;

the non-display region including a first region encapsulating the display region and disposed adjacent to the display region, and a second region separated from a bottom edge of the display region, the second region connecting to the display region via the first region, the first region configured to dispose traces, the second region configured to dispose a driving chip assembly;

the first region including a first subregion encapsulating the display region, circuitous ground wires zigzagged from an inner side to an outer side disposed in the first subregion, a number of layers of an end of the ground wires close to the second region less than a number of layers of an end of the ground wires away from the second region.

In the display panel of the present application, the first region further includes a second subregion configured to dispose touch signal traces, an inner side of the second subregion connects to both of a left side and a right side of the display region, an outer side of the second subregion connects to an inner side of the first subregion.

In the display panel of the present application, the first region further includes a third subregion, one side of the third subregion connects to the bottom edge of the display region and another side of the third subregion connects to the first region, the third subregion is configured to dispose display signal trances.

In the display panel of the present application, a number of the ground wires is two, the two ground wires are symmetrically disposed with respect to the display region, distal ends of the two ground wires are close to each other, proximal ends of the two ground wires extend to the third subregion.

In the display panel of the present application, each of the ground wires includes a first segment, a second segment, and a third segment;

the first segment is disposed close to an outer side of the first subregion, a first end of the second segment connects to a portion of the first segment close to the second region and a second end of the second segment extends to a location away from a top edge of the display region with a predetermined distance, a first end of the third segment connects to the second end of the second segment and a second end of the third segment extends to the driving chip assembly.

In the display panel of the present application, wherein the driving chip assembly includes a display driving chip and a touch driving chip, the display driving chip connects to the display signal trances, the touch driving chip connects to the touch signal traces.

The array substrate and the display panel of the present application yields a beneficial effect of lowering a risk of damage by the electrostatic charges.

DESCRIPTION OF DRAWINGS

To illustrate the technical solutions in the embodiments of the present application more clearly, the following briefly introduces the accompanying drawings required for describing the embodiments of the present application. Apparently, the accompanying drawings in the following description show some embodiments of the present application, and a person of ordinary skill in the art may still derive other drawings from these accompanying drawings without creative efforts.

DESCRIPTION OF EMBODIMENTS OF DISCLOSURE

Figure 1:
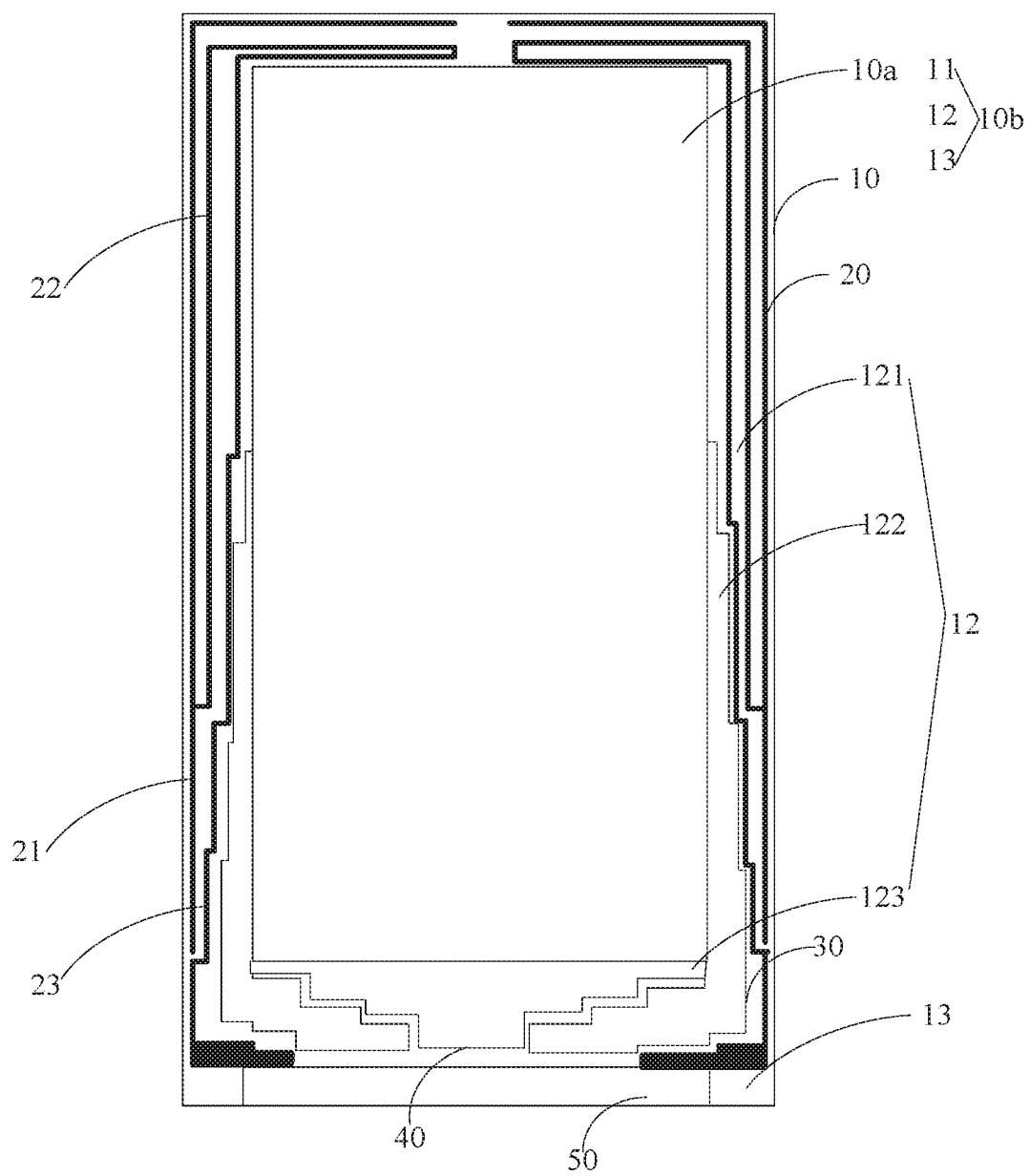
FIG. 1 is a schematic structural diagram illustrating an array substrate in accordance with an embodiment of the present application.

The embodiments of the present application will be described in detail below. The embodiments are illustrated in the appending drawings, in which the same or similar reference numbers are throughout referred to as the same or similar components or the components having the same or similar functions. The embodiments described below with reference to the appending drawings are exemplary and are merely used to illustrate the present application, and should not be construed as limitations of the present application.

In the description of the present application, it is to be understood that the terms "center", "longitudinal", "lateral", "length", "width", "thickness", "upper", "lower", "front", "rear", "left", "right", "vertical", "horizontal", "top", "bottom", "inner", "outer", "clockwise", "counterclockwise" and the like indicated orientation or positional relationship based on the relationship of the position or orientation shown in the drawings, which is only for the purpose of facilitating describing the description and simplifying the description, but is not intended or implied that the device or element referred to must have a specific orientation, and be constructed and operated in a particular orientation. Therefore, it should not be understood as a limitation of the present application. In addition, terms such as "first" and "second" are used herein for purposes of description and are not intended to indicate or imply relative importance or imply the number of features. Thus, the feature defined with "first" and "second" may include one or more of this feature. In the description of the present application, "a plurality of" means two or more than two, unless specified otherwise.

In the description of the present application, it is noted that unless specified or limited otherwise, the terms "mounted," "connected," "coupled," "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

In the present application, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above" or "on top of" a second feature may include an embodiment in which the first feature is right or obliquely "on," "above" or "on top of" the second feature, or just means that the first feature is at a height higher than that of the second feature; while a first feature "below," "under" or "on bottom of" a second feature may include an embodiment in which the first feature is right or obliquely "below,"

"under" or "on bottom of" the second feature, or just means that the first feature is at a height lower than that of the second feature.

The following disclosure provides many different embodiments or examples to implement different structures of the present application. In order to simplify the disclosure of the present application, the components and arrangements of specific examples are described in the following. Apparently, they are just exemplary, and do not intend to limit the present application. In addition, reference numbers and/or letters can be repeated in different examples of the present application for the purposes of simplification and clearness, without indicating the relationships between the discussed embodiments and/or arrangements. Further, the present application provides examples of various specific processes and materials, but an ordinary person in the art can realize the availability of other processes and/or usage of other materials.

FIG. 1 is a schematic structural diagram illustrating an array substrate in accordance with an embodiment of the present application. The array substrate 10 includes a display region 10a and a non-display region 10b. The non-display region 10b encapsulates the display region 10a.

The non-display region 10b includes a first region 12 encapsulating the display region 10a and disposed adjacent to the display region 10a, and a second region 13 separated from a bottom edge of the display region 10a. The second region 13 connects to the display region 10a via the first region 12. The first region 12 is configured to dispose traces. The second region 13 is configured to dispose a driving chip assembly 50.

Specifically, the display region 10a roughly forms a rectangle or a rectangle with round corners.

The second region 13 is disposed away from the display region 10a with a predetermined distance. The driving chip assembly 50 is disposed in the second region 13. The driving chip assembly 50 may include a touch driving chip and a display driving chip, or both of them are assembled together.

The first region 12 includes a first subregion 121, a second subregion 122, and a third subregion 123.

The first subregion 121 encapsulates the display region 10a. The second subregion 122 is disposed between the display region 10a and the first subregion 121. An inner side of the second subregion 122 connects to both of a left side and a right side of the display region 10a. An outer side of the second subregion 122 connects to an inner side of the first subregion 121. The third subregion 123 is located between the display region 10a and the second region 13. One side of the third subregion 123 connects to the bottom edge of the display region 10a and another side of the third subregion 123 connects to the second region 13.

Circuitous ground wires 20 zigzagged from an inner side to an outer side are disposed in the first subregion 121. A number of layers of an end of the ground wires 20 close to the second region 13 is less than a number of layers of an end of the ground wires 20 away from the second region 13. The second subregion is configured to dispose touch signal traces 30. The third subregion is configured to dispose display signal trances 40. The display driving chip connects to the display signal trances 40. The touch driving chip connects to the touch signal traces 30.

A number of the ground wires 20 is two. The two ground wires 20 are symmetrically disposed with respect to the display region 10a. Distal ends of the two ground wires 20 are close to each other. Proximal ends of the two ground wires 20 extend to the third subregion 123.

Specifically, each of the ground wires 20 includes a first segment 21, a second segment 22, and a third segment 23.

The first segment 21 is disposed close to an outer side of the first subregion 121. A first end of the second segment 22 connects to a portion of the first segment 21 close to the second region 13 and a second end of the second segment 22 extends to a location away from a top edge of the display region 10a with a predetermined distance. A first end of the third segment 23 connects to the second end of the second segment 22 and a second end of the third segment 23 extends to the driving chip assembly 50.

The first segment 21, the second segment 22, and the third segment 23 have a same width. A separated distance between the first segment 21 and the second segment 22 is equal to a separated distance between the second segment 22 and the third segment 23.

Figure 2:
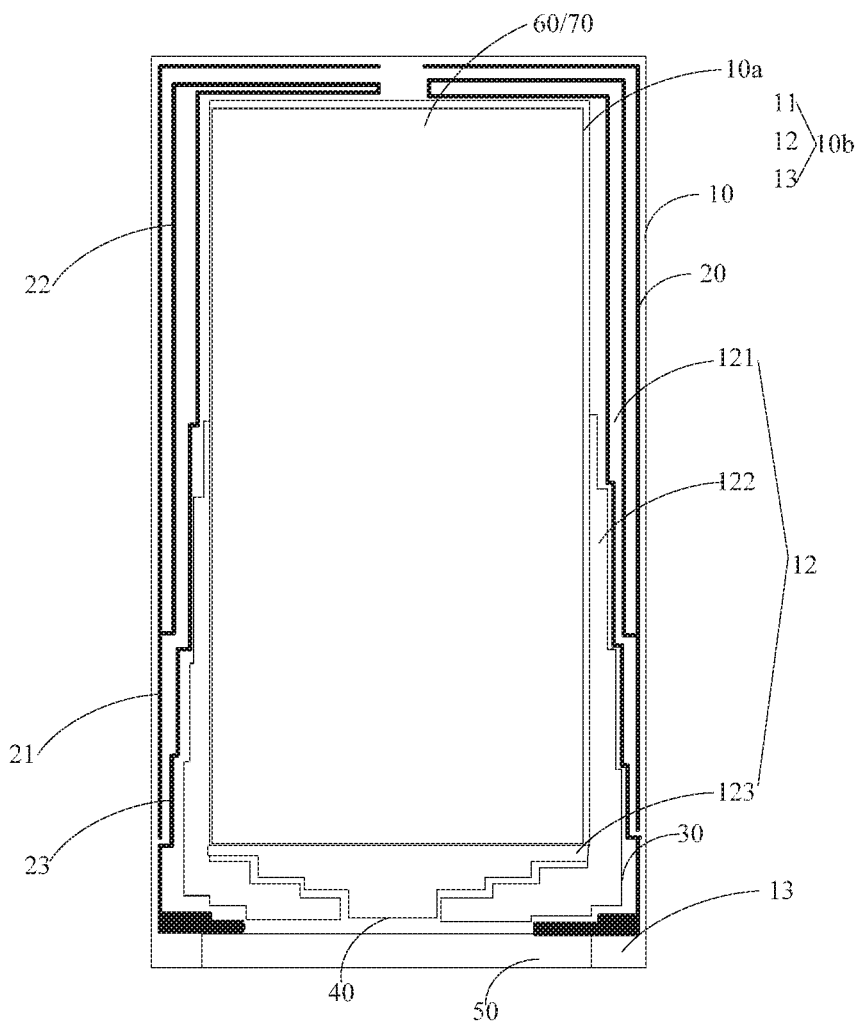
FIG. 2 is a schematic structural diagram illustrating a display panel in accordance with an embodiment of the present application.

FIG. 2 is a schematic structural diagram illustrating a display panel in accordance with an embodiment of the present application. The display panel is an organic light emitting diode (OLED) display panel including an array substrate 10, a light emitting layer 60 disposed on the array substrate 10, and a touch driving layer 70 disposed on the light emitting layer 60.

The array substrate 10 includes a display region 10a and a non-display region 10b. The non-display region 10b encapsulates the display region 10a.

The non-display region 10b includes a first region 12 encapsulating the display region 10a and disposed adjacent to the display region 10a, and a second region 13 separated from a bottom edge of the display region 10a. The second region 13 connects to the display region 10a via the first region 12. The first region 12 is configured to dispose traces. The second region 13 is configured to dispose a driving chip assembly 50.

Specifically, the display region 10a roughly forms a rectangle or a rectangle with round corners.

The second region 13 is disposed away from the display region 10a with a predetermined distance. The driving chip assembly 50 is disposed in the second region 13. The driving chip assembly 50 may include a touch driving chip and a display driving chip, or both of them are assembled together.

The first region 12 includes a first subregion 121, a second subregion 122, and a third subregion 123.

The first subregion 121 encapsulates the display region 10a. The second subregion 122 is disposed between the display region 10a and the first subregion 121. An inner side of the second subregion 122 connects to both of a left side and a right side of the display region 10a. An outer side of the second subregion 122 connects to an inner side of the first subregion 121. The third subregion 123 is located between the display region 10a and the second region 13. One side of the third subregion 123 connects to the bottom edge of the display region 10a and another side of the third subregion 123 connects to the second region 13.

Circuitous ground wires 20 zigzagged from an inner side to an outer side are disposed in the first subregion 121. A number of layers of an end of the ground wires 20 close to the second region 13 is less than a number of layers of an end of the ground wires 20 away from the second region 13. The second subregion is configured to dispose touch signal traces 30. The third subregion is configured to dispose display signal trances 40. The display driving chip connects to the display signal trances 40. The touch driving chip connects to the touch signal traces 30.

A number of the ground wires 20 is two. The two ground wires 20 are symmetrically disposed with respect to the display region 10a. Distal ends of the two ground wires 20 are close to each other. Proximal ends of the two ground wires 20 extend to the third subregion 123.

Specifically, each of the ground wires 20 includes a first segment 21, a second segment 22, and a third segment 23.

The first segment 21 is disposed close to an outer side of the first subregion 121. A first end of the second segment 22 connects to a portion of the first segment 21 close to the second region 13 and a second end of the second segment 22 extends to a location away from a top edge of the display region 10a with a predetermined distance. A first end of the third segment 23 connects to the second end of the second segment 22 and a second end of the third segment 23 extends to the driving chip assembly 50.

The first segment 21, the second segment 22, and the third segment 23 have a same width. A separated distance between the first segment 21 and the second segment 22 is equal to a separated distance between the second segment 22 and the third segment 23.

Detail descriptions of the array substrate and the display panel provided in the embodiments of the present application are presented above. Specific examples are used in the context in illustrating the principles and embodiments of the present application. The descriptions of foregoing embodiments are only intended to facilitate understanding of the present application. Any modification made to the embodiments and applications may be made by persons of ordinary skills in the art based on ideas of the present application. Above all, the present specification should not be understood as limitation to the present application.

What is claimed is:

1. An array substrate, comprising a display region and a non-display region, the non-display region encapsulating the display region and the display region forming a rectangle; the non-display region comprising a first region encapsulating the display region and disposed adjacent to the display region, and a second region separated from a first edge of the display region, the second region connecting to the display region via the first region, the first region configured to dispose traces, the second region configured to dispose a driving chip assembly; the first region comprising a first subregion encapsulating the display region, circuitous ground wires zigzagged from an inner side to an outer side disposed in the first subregion, a number of layers of an end of the ground wires close to the second region less than a number of layers of an end of the ground wires away from the second region.

2. The array substrate according to claim 1, wherein the first region further comprises a second subregion configured to dispose touch signal traces, an inner side of the second subregion connects to both of a left side and a right side of the display region, an outer side of the second subregion connects to an inner side of the first subregion.

3. The array substrate according to claim 2, wherein the first region further comprises a third subregion, one side of the third subregion connects to the first edge of the display region and another side of the third subregion connects to the second region, the third subregion is configured to dispose display signal traces.

4. The array substrate according to claim 3, wherein a number of the ground wires is two, the two ground wires are symmetrically disposed with respect to the display region, distal ends of the two ground wires are close to each other, proximal ends of the two ground wires extend to the third subregion.

5. The array substrate according to claim 4, wherein each of the ground wires comprises a first segment, a second segment, and a third segment;
the first segment is disposed close to an outer side of the first subregion, a first end of the second segment connects to a portion of the first segment close to the second region and a second end of the second segment extends to a location away from a second edge of the display region with a predetermined distance, a first end of the third segment connects to the second end of the second segment and a second end of the third segment extends to the driving chip assembly.

6. The array substrate according to claim 3, wherein the driving chip assembly comprises a display driving chip and a touch driving chip, the display driving chip connects to the display signal traces, the touch driving chip connects to the touch signal traces.

7. An array substrate, comprising a display region and a non-display region, the non-display region encapsulating the display region;
the non-display region comprising a first region encapsulating the display region and disposed adjacent to the display region, and a second region separated from a first edge of the display region, the second region connecting to the display region via the first region, the first region configured to dispose traces, the second region configured to dispose a driving chip assembly;
the first region comprising a first subregion encapsulating the display region, circuitous ground wires zigzagged from an inner side to an outer side disposed in the first subregion, a number of layers of an end of the ground wires close to the second region less than a number of layers of an end of the ground wires away from the second region.

8. The array substrate according to claim 7, wherein the first region further comprises a second subregion configured to dispose touch signal traces, an inner side of the second subregion connects to both of a left side and a right side of the display region, an outer side of the second subregion connects to an inner side of the first subregion.

9. The array substrate according to claim 8, wherein the first region further comprises a third subregion, one side of the third subregion connects to the first edge of the display region and another side of the third subregion connects to the second region, the third subregion is configured to dispose display signal traces.

10. The array substrate according to claim 9, wherein a number of the ground wires is two, the two ground wires are symmetrically disposed with respect to the display region, distal ends of the two ground wires are close to each other, proximal ends of the two ground wires extend to the third subregion.

11. The array substrate according to claim 10, wherein each of the ground wires comprises a first segment, a second segment, and a third segment;
the first segment is disposed close to an outer side of the first subregion, a first end of the second segment connects to a portion of the first segment close to the second region and a second end of the second segment extends to a location away from a second edge of the display region with a predetermined distance, a first end of the third segment connects to the second end of the second segment and a second end of the third segment extends to the driving chip assembly.

12. The array substrate according to claim 9, wherein the driving chip assembly comprises a display driving chip and a touch driving chip, the display driving chip connects to the display signal traces, the touch driving chip connects to the touch signal traces.

13. A display panel, comprising an array substrate comprising a display region and a non-display region, the non-display region encapsulating the display region;
the non-display region comprising a first region encapsulating the display region and disposed adjacent to the display region, and a second region separated from a first edge of the display region, the second region connecting to the display region via the first region, the first region configured to dispose traces, the second region configured to dispose a driving chip assembly;
the first region comprising a first subregion encapsulating the display region, circuitous ground wires zigzagged from an inner side to an outer side disposed in the first subregion, a number of layers of an end of the ground wires close to the second region less than a number of layers of an end of the ground wires away from the second region.

14. The display panel according to claim 13, wherein the first region further comprises a second subregion configured to dispose touch signal traces, an inner side of the second subregion connects to both of a left side and a right side of the display region, an outer side of the second subregion connects to an inner side of the first subregion.

15. The display panel according to claim 13, wherein the first region further comprises a third subregion, one side of the third subregion connects to the first edge of the display region and another side of the third subregion connects to the second region, the third subregion is configured to dispose display signal traces.

16. The display panel according to claim 15, wherein a number of the ground wires is two, the two ground wires are symmetrically disposed with respect to the display region, distal ends of the two ground wires are close to each other, proximal ends of the two ground wires extend to the third subregion.

17. The display panel according to claim 16, wherein each of the ground wires comprises a first segment, a second segment, and a third segment;
the first segment is disposed close to an outer side of the first subregion, a first end of the second segment connects to a portion of the first segment close to the second region and a second end of the second segment extends to a location away from a second edge of the display region with a predetermined distance, a first end of the third segment connects to the second end of the second segment and a second end of the third segment extends to the driving chip assembly.

18. The display panel according to claim 15, wherein the driving chip assembly comprises a display driving chip and a touch driving chip, the display driving chip connects to the display signal traces, the touch driving chip connects to the touch signal traces.

* * * * *